(12) United States Patent
Eldershaw

(10) Patent No.: US 7,638,438 B2
(45) Date of Patent: Dec. 29, 2009

(54) SOLAR CELL FABRICATION USING EXTRUSION MASK

(75) Inventor: Craig Eldershaw, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 383 days.

(21) Appl. No.: 11/609,787

(22) Filed: Dec. 12, 2006

(65) Prior Publication Data

US 2008/0138999 A1 Jun. 12, 2008

(51) Int. Cl.
*H01L 21/76* (2006.01)
*H01L 21/31* (2006.01)
*H01L 21/469* (2006.01)

(52) U.S. Cl. .............. 438/759; 438/462
(58) Field of Classification Search ........ 438/462, 438/758–759, E21.24
See application file for complete search history.

(56) References Cited

U.S. PATENT DOCUMENTS

| | | | |
|---|---|---|---|
| 2,789,731 | A | 4/1957 | Marraffino |
| 3,032,008 | A | 5/1962 | Land et al. |
| 3,159,313 | A | 12/1964 | Guilford |
| 3,602,193 | A | 8/1971 | Adams et al. |
| 3,973,994 | A | 8/1976 | Redfield |
| 3,988,166 | A | 10/1976 | Beam |
| 4,018,367 | A | 4/1977 | Morine et al. |
| 4,021,267 | A | 5/1977 | Dettling |
| 4,045,246 | A | 8/1977 | Mlavsky et al. |
| 4,053,327 | A | 10/1977 | Meulenberg, Jr. |
| 4,084,985 | A | 4/1978 | Evans, Jr. |
| 4,086,485 | A | 4/1978 | Kaplow et al. |
| 4,095,997 | A | 6/1978 | Griffiths |
| 4,119,058 | A | 10/1978 | Schmermund |
| 4,131,485 | A | 12/1978 | Meinel et al. |

(Continued)

FOREIGN PATENT DOCUMENTS

CN 2606309 Y 3/2004

(Continued)

OTHER PUBLICATIONS

Alvarez et al. "RXI Concentrator For 1000X Photovoltaic Energy Conversion".
Benitez et al. "High-Concentration Mirror-Based Kohler Integrating System for Tandem Solar Cells", WCPEC2006, 4 pages.
Bett et al. "FLATCON™ and FLASHCON™ Concepts for High Concentration PV", Presented at the 19$^{th}$ European Photovoltaic Solar Energy Conf., Jun. 7-11, 2004, Paris, 4 pages.

(Continued)

*Primary Examiner*—Cuong Q Nguyen
(74) *Attorney, Agent, or Firm*—Bever, Hoffman & Harms, LLP; Patrick T. Bever

(57) ABSTRACT

Large-area ICs (e.g., silicon wafer-based solar cells) are produced by positioning a mask between an extrusion head and the IC wafer during extrusion of a dopant bearing material or metal gridline material. The mask includes first and second peripheral portions that are positioned over corresponding peripheral areas of the wafer, and a central opening that exposes a central active area of the wafer. The extrusion head is then moved relative to the wafer, and the extrusion material is continuously extruded through outlet orifices of the extrusion head to form elongated extruded structures on the active area of the wafer. The mask prevents deposition of the extrusion material along the peripheral edges of the wafer, and facilitates the formation of unbroken extrusion structures. The mask may be provided with a non-rectangular opening to facilitate the formation of non-rectangular (e.g., circular) two-dimensional extrusion patterns.

17 Claims, 9 Drawing Sheets

U.S. PATENT DOCUMENTS

| | | |
|---|---|---|
| 4,141,231 A | 2/1979 | Kudlich |
| 4,148,301 A | 4/1979 | Cluff |
| 4,153,476 A | 5/1979 | Shelpuk |
| 4,177,083 A | 12/1979 | Kennedy |
| 4,221,468 A | 9/1980 | Macken |
| 4,224,081 A | 9/1980 | Kawamura et al. |
| 4,254,894 A | 3/1981 | Fetters |
| 4,331,703 A | 5/1982 | Lindmayer |
| 4,337,758 A | 7/1982 | Meinel et al. |
| 4,355,196 A | 10/1982 | Chai |
| 4,461,403 A | 7/1984 | Prahs |
| 4,476,165 A | 10/1984 | McIntyre |
| 4,490,418 A | 12/1984 | Yoshida |
| 4,521,457 A | 6/1985 | Russell et al. |
| 4,540,843 A | 9/1985 | Gochermann et al. |
| 4,602,120 A | 7/1986 | Wakefield et al. |
| 4,683,348 A | 7/1987 | Pidgeon et al. |
| 4,746,370 A | 5/1988 | Woolf |
| 4,747,517 A | 5/1988 | Hart |
| 4,792,685 A | 12/1988 | Yamakawa |
| 4,796,038 A | 1/1989 | Allen et al. |
| 4,841,946 A | 6/1989 | Marks |
| 4,847,349 A | 7/1989 | Ohta et al. |
| 4,849,028 A | 7/1989 | Krause |
| 4,855,884 A | 8/1989 | Richardson |
| 4,938,994 A | 7/1990 | Choinski |
| 4,947,825 A | 8/1990 | Moriarty |
| 4,952,026 A | 8/1990 | Bellman et al. |
| 5,000,988 A | 3/1991 | Inoue et al. |
| 5,004,319 A | 4/1991 | Smither |
| 5,011,565 A | 4/1991 | Dube et al. |
| 5,062,899 A | 11/1991 | Kruer |
| 5,075,281 A | 12/1991 | Testardi |
| 5,089,055 A | 2/1992 | Nakamura |
| 5,151,377 A | 9/1992 | Hanoka et al. |
| 5,167,724 A | 12/1992 | Chiang |
| 5,180,441 A | 1/1993 | Cornwall et al. |
| 5,213,628 A | 5/1993 | Noguchi et al. |
| 5,216,543 A | 6/1993 | Calhoun |
| 5,254,388 A | 10/1993 | Melby et al. |
| 5,344,496 A | 9/1994 | Stern et al. |
| 5,356,488 A | 10/1994 | Hezel |
| 5,389,159 A | 2/1995 | Kataoka et al. |
| 5,501,743 A | 3/1996 | Cherney |
| 5,529,054 A | 6/1996 | Shoen |
| 5,536,313 A | 7/1996 | Watanabe et al. |
| 5,538,563 A | 7/1996 | Finkl |
| 5,543,333 A | 8/1996 | Holdermann |
| 5,552,820 A | 9/1996 | Genovese |
| 5,559,677 A | 9/1996 | Errichiello |
| 5,560,518 A | 10/1996 | Catterall et al. |
| 5,569,399 A | 10/1996 | Penney et al. |
| 5,590,818 A | 1/1997 | Raba et al. |
| 5,665,175 A | 9/1997 | Safir |
| 5,700,325 A | 12/1997 | Watanabe |
| 5,873,495 A | 2/1999 | Saint-Germain |
| 5,918,771 A | 7/1999 | van der Heijden |
| 5,929,530 A | 7/1999 | Stone |
| 5,949,123 A | 9/1999 | Le et al. |
| 5,981,902 A | 11/1999 | Arita et al. |
| 5,990,413 A | 11/1999 | Ortabasi |
| 6,011,307 A | 1/2000 | Jiang et al. |
| 6,020,554 A | 2/2000 | Kaminar et al. |
| 6,032,997 A | 3/2000 | Elliott et al. |
| 6,047,862 A | 4/2000 | Davies |
| 6,130,465 A | 10/2000 | Cole |
| 6,140,570 A | 10/2000 | Kariya |
| 6,164,633 A | 12/2000 | Mulligan et al. |
| 6,203,621 B1 | 3/2001 | Tran et al. |
| 6,232,217 B1 | 5/2001 | Ang et al. |
| 6,257,450 B1 | 7/2001 | Jackson et al. |
| 6,274,508 B1 | 8/2001 | Jacobsen et al. |
| 6,278,054 B1 | 8/2001 | Ho et al. |
| 6,293,498 B1 | 9/2001 | Stanko et al. |
| 6,310,281 B1 | 10/2001 | Wendt et al. |
| 6,351,098 B1 | 2/2002 | Kaneko |
| 6,354,791 B1 | 3/2002 | Wytman et al. |
| 6,379,521 B1 | 4/2002 | Nishio |
| 6,398,370 B1 | 6/2002 | Chiu et al. |
| 6,407,329 B1 | 6/2002 | Iino et al. |
| 6,418,986 B1 | 7/2002 | Gabriele |
| 6,420,266 B1 | 7/2002 | Smith et al. |
| 6,423,140 B1 | 7/2002 | Liu et al. |
| 6,479,395 B1 | 11/2002 | Smith et al. |
| 6,527,964 B1 | 3/2003 | Smith et al. |
| 6,531,653 B1 | 3/2003 | Glenn et al. |
| 6,555,739 B2 | 4/2003 | Kawam |
| 6,568,863 B2 | 5/2003 | Murata |
| 6,590,235 B2 | 7/2003 | Carey et al. |
| 6,597,510 B2 | 7/2003 | Bunkenburg et al. |
| 6,623,579 B1 | 9/2003 | Smith et al. |
| 6,663,944 B2 | 12/2003 | Park et al. |
| 6,666,165 B2 | 12/2003 | Shiraishi et al. |
| 6,667,434 B2 | 12/2003 | Morizane et al. |
| 6,743,478 B1 | 6/2004 | Kiiha et al. |
| 6,896,381 B2 | 5/2005 | Benitez et al. |
| 6,924,493 B1 | 8/2005 | Leung |
| 7,045,794 B1 | 5/2006 | Spallas et al. |
| 7,101,592 B2 | 9/2006 | Gueggi et al. |
| 7,152,985 B2 | 12/2006 | Benitez et al. |
| 7,160,522 B2 | 1/2007 | Minano Dominguez et al. |
| 7,181,378 B2 | 2/2007 | Benitez etal. |
| 7,388,147 B2 | 6/2008 | Mulligan et al. |
| 7,394,016 B2 | 7/2008 | Gronet |
| 2001/0008230 A1 | 7/2001 | Keicher et al. |
| 2002/0056473 A1 | 5/2002 | Chandra et al. |
| 2002/0060208 A1 | 5/2002 | Liu et al. |
| 2002/0148497 A1 | 10/2002 | Sasaoka et al. |
| 2002/0149107 A1 | 10/2002 | Chang et al. |
| 2002/0154396 A1 | 10/2002 | Overbeck |
| 2003/0015820 A1 | 1/2003 | Yamazaki et al. |
| 2003/0095175 A1 | 5/2003 | Agorio |
| 2003/0129810 A1* | 7/2003 | Barth et al. ................. 438/462 |
| 2003/0201581 A1 | 10/2003 | Weber et al. |
| 2003/0232174 A1 | 12/2003 | Chang et al. |
| 2004/0012676 A1 | 1/2004 | Weiner |
| 2004/0031517 A1 | 2/2004 | Bareis |
| 2004/0048001 A1 | 3/2004 | Kiguchi et al. |
| 2004/0070855 A1 | 4/2004 | Benitez et al. |
| 2004/0084077 A1 | 5/2004 | Aylaian |
| 2004/0151014 A1 | 8/2004 | Speakman |
| 2004/0191422 A1 | 9/2004 | Kataoka |
| 2004/0200520 A1 | 10/2004 | Mulligan et al. |
| 2004/0211460 A1 | 10/2004 | Simburger et al. |
| 2005/0000566 A1 | 1/2005 | Posthuma et al. |
| 2005/0029236 A1 | 2/2005 | Gambino et al. |
| 2005/0034751 A1 | 2/2005 | Gross et al. |
| 2005/0046977 A1 | 3/2005 | Shifman |
| 2005/0133084 A1 | 6/2005 | Joge et al. |
| 2005/0194037 A1 | 9/2005 | Asai |
| 2005/0221613 A1 | 10/2005 | Ozaki et al. |
| 2005/0253308 A1 | 11/2005 | Sherwood |
| 2006/0207650 A1 | 9/2006 | Winston et al. |
| 2006/0231133 A1 | 10/2006 | Fork et al. |
| 2006/0251796 A1 | 11/2006 | Fellingham |
| 2006/0266235 A1 | 11/2006 | Sandhu et al. |
| 2008/0047605 A1 | 2/2008 | Benitez et al. |
| 2008/0138456 A1 | 6/2008 | Fork et al. |

FOREIGN PATENT DOCUMENTS

| | | |
|---|---|---|
| CN | 1854637 A | 11/2006 |
| DE | 197 35 281 A1 | 2/1999 |
| EP | 0 257 157 A | 3/1988 |

| | | | |
|---|---|---|---|
| EP | 1 145 797 A | 10/2001 | |
| EP | 1 763 086 A | 3/2007 | |
| EP | 1 833 099 A | 9/2007 | |
| JP | 60082680 A | 5/1985 | |
| JP | 02 187291 A | 7/1990 | |
| JP | 2002111035 A | 4/2002 | |
| JP | 2004-266023 A | 9/2004 | |
| JP | 2005051216 | 2/2005 | |
| WO | WO 91/08503 A | 6/1991 | |
| WO | WO 91/15355 | 10/1991 | |
| WO | WO 94/28361 A1 | 12/1994 | |
| WO | WO 97/21253 A | 6/1997 | |
| WO | WO 97/48519 A | 12/1997 | |
| WO | WO 00/49421 A1 | 8/2000 | |
| WO | WO 00/49658 A1 | 8/2000 | |
| WO | WO 00/50215 | 8/2000 | |
| WO | WO 02/052250 A | 7/2002 | |
| WO | WO 02/097724 A1 | 12/2002 | |
| WO | WO 2005/070224 A1 | 8/2005 | |
| WO | WO 2005/107957 A1 | 11/2005 | |
| WO | WO 2005/107958 A1 | 11/2005 | |
| WO | WO 2006/097303 A | 9/2006 | |
| WO | WO 2007/104028 | 9/2007 | |

OTHER PUBLICATIONS

Gordon et al. "Optical performance at the thermodynamic limit with tailored imaging designs", Applied Optics, in press, Dec. 2004, 16 pages.

Kenis et al. "Fabrication inside Microchannels Using Fluid Flow", Accounts of Chemical Research, vol. 33, No. 12, 2000, pp. 841-847.

Mulligan et al. "A Flat-Plate Concentrator: Micro-Concentrator Design Overview", 2000 IEEE, pp. 1495-1497.

Mulligan et al. "Development Of Chip-Size Silicon Solar Cells".

Nguyen, Luu "Wafer Level Packaging For Analog/Mixed Signal Applications", MEPTEC Int. Wafer Level Packaging Conference, Aug. 22, 2002, 41 pages.

Sun et al. "Modeling and Experimental Evaluation of Passive Heat Sinks for Miniature High-Flux Photovoltaic Concentrators", Transactions of the ASME, vol. 127, pp. 138-145 (2005).

Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.

Swanson, Richard M. "The Promise of Concentrators", *Prog. Photovolt. Res. Appl.* 8, pp. 93-111 (2000).

Terao at al. "A Mirror-Less Design for Micro-Concentrator Modules", Conference Record of the $28^{th}$ IEEE Photovoltaic Specialists Conference (2000) pp. 1416-1419.

Terao, Akira "MicroDish: A Novel Reflective Optic For Flat-Plate Micro-Concentrator", SPIE's $49^{th}$ Annual Meeting, Aug. 2-6, 2004, Denver, Colorado, USA, 9 pages.

Sparber et al. "Comparison of texturing methods for monocrystalline silicon solar cells using KOH and $Na_2CO_3$," $3^{rd}$ World Conf. Photovoltaic Energy Conversion, Osaka, 2003, pp. 1372-1375.

MacDonald et al. "Texturing industrial multicrystalline silicon solar cells," Solar Energy, vol. 76, 2004, pp. 277-283.

Tool et al. "Straightforward in-line processing for 16.8% efficient mc-Si solar cells," $31^{st}$ IEEE Photovoltaic Specialists Conf., Florida, 2005, pp. 1324-1327.

Fukui et al. "17.7% efficiency large area multicrystalline silicon solar cell using screen-printed metallization technique," $31^{st}$ IEEE Photovoltaic Specialists Conf., Florida, 2005, pp. 979-982.

Mitsubishi Electric Corp., Mitsubishi Electric Develops Practical-Use Multi-Crystalline Silicon Solar Cell with World's Highest Conversion Efficiency Rate of 18.6%, News Release #2432, Tokyo, Mar. 19, 2008, Available URL: http://global.mitsubishielectric.com/news/news_releases/2008/me10705.pdf.

Zhao et al. "19.8% efficient 'honeycomb' textured multicrystalline and 24.4% monocrystalline silicon solar cells," Applied Physics Letters, vol. 73, pp. 1991-1993, 1998.

Abbott et al. "Optical and Electrical Properties of Laser Texturing for High-efficiency Solar Cells," Progress in Photovoltaics: Research and Applications, Published online Jan. 5, 2006, vol. 14, pp. 225-235, 2006.

Cousins et al. "Manufacturing and Design Issues for Thin Silicon Solar Cells Manufactured on FZ(B), MCZ(B), CZ(Ga) and CZ(B) Wafers", IEEE, pp. 987-990, 2005.

Cuevas et al. "50 Per Cent More Output Power from an Albedo-Collecting Flat Panel Using Bifacial Solar Cells", *Solar Energy*, vol. 29, No. 5, pp. 419-420, 1982.

Finlayson et al. "$Bi_2O_3$-$Wo_3$ compounds for photocatalytic applications by solid state and viscous processing", Title from a conference scheduled for Oct. 6-7, 2004 in Munich, 8 pages.

Kränzl et al. "Bifacial Solar Cells on Multi-Crystalline Silicon", $15^{th}$ International Photovoltaic Science & Engineering Conference, Shanghai, China, 2 pages, 2005.

Mueller et al. "Breathable Polymer Films Produced by the Microlayer Coextrusion Process", Journal of Applied Polymer Science, vol. 78, pp. 816-828, 2000.

Rao et al. "Microfabricated Deposition Nozzles for Direct-Write Assembly of Three-Dimensional Periodic Structures", *Advanced Materials*, vol. 17, No. 3, Feb. 10, 2005, 5 pages.

Recart et al. "Large Area Thin BSF Solar Cells With Simultaneously Diffused Boron and Phosphorus Screen Printed Emitters", IEEE, pp. 1213-1216, 2005.

Taguchi et al. An Approach for the Higher Efficiency in the HIT Cells, IEEE, pp. 866-871, 2005.

Van Hoy et al. "Microfabrication of Ceramics by Co-extrusion", *J. Am. Ceram. Soc.*, vol. 81, No. 1, pp. 152-158, 1998.

U.S. Appl. No. 11/282,882, filed Nov. 17, 2005, Fork et al.

Weber et al. "Modelling of Sliver® Modules Incorporating a Lambertian Rear Reflector", The Australian National University, Canberra ACT 0200, Australia, 4 pages, 2005.

Gimac Compact Triplex TR12 Micro-Coextrusion Plant, NPE 2000, Jun. 19-23, 2000, McCormick Place, Chicago, IL, Booth 13154, http://www.citsco.com/NPE2000/npepage1.html, 2 pages.

Extrusion/Coextrusion Dies, Extrusion Dies Industries, LLC, http://www.extrusiondies.com/PRODUCTS/ExtrusionDies/multimanifoldDies.html, 1 page.

Hitachi: Offering Total Environmental Solutions, Environmental Activities, http://greenweb.hitachi.co.jp/en/sustainable/total-solution.html, 5 pages, 2003.

Sanyo Solar Panels, Sanyo HIT Solar Panel Discount—Solar Electric Supply, Sanyo Solar Modules, http://www.solarelectricsupply.com/Solar_Panels/Sanyo/sanyo.html, 4 pages, 2005.

U.S. Appl. No. 11/282,829, filed Nov. 17, 2005, Fork et al.

U.S. Appl. No. 11/336,714, filed Jan. 20, 2006, Fork et al.

Brogren et al. "Optical properties, durability, and system aspects of a new aluminum-polymer-laminated steel reflector for solar concentrators", Jan. 2004, Solar Energy Materials and Solar Cells, 82, pp. 387-412.

Mauk et al. "'Buried' Metal/Dielectric/Semiconductor Reflectors for Light Trapping in Epitaxial Thin-Film Solar Cells", May 1996, IEEE, 25th PVSC, pp. 147-150.

Munzer et al. "Thin Monocrystalline Silicon Solar Cells, Oct. 1999, IEEE Transactions on Electron Devices", vol. 46, No. 10, pp. 2055-2061.

Kerschaver et al. "Back-contact Solar Cells: A Review," Progress in Photovoltaics: Research and Applications, 2006, vol. 14, pp. 107-123.

Neuhaus et al. "Industrial Silicon Wafer Solar Cells," Advances in OptoElectronics, vol. 2007, 2007, 15 pages.

SunPower Corp. News Release, May 12, 2008, Available URL: http://investors.sunpowercorp.com/releasedetail.cfm?ReleaseID=309613.

Schweizer, Peter M. "Curtain Coating Technology Can Mean Big Benefits," Paper, Film & Foil Converter website, Mar. 1, 2000, 5 pages, http://pffc-online.com/mag/paper_curtain_coating_technology/.

NIJS et al. "Overview of solar cell technologies and results on high efficiency multicrystalline silicon substrates," Solar Energy Materials and Solar Cells, vol. 48, No. 1-4, Nov. 1, 1997, pp. 199-217.

\* cited by examiner

SOLAR CELL FABRICATION USING EXTRUSION MASK

FIELD OF THE INVENTION

This invention relates to the conversion of light irradiation to electrical energy, more particularly, to methods and tools for producing photovoltaic devices (solar cells) that convert solar energy to electrical energy.

BACKGROUND OF THE INVENTION

Solar cells are typically photovoltaic devices that convert sunlight directly into electricity. Solar cells typically include a semiconductor (e.g., silicon) wafer (substrate) that absorbs light irradiation (e.g., sunlight) in a way that creates free electrons, which in turn are caused to flow in the presence of a built-in field to create direct current (DC) power. The DC power generated by several solar cells may be collected on a grid placed on the cell. Solar cells are typically made using round silicon wafers that are doped to include one or more n-type doped regions, and one or more p-type doped regions. Such solar cells (also known as silicon wafer-based solar cells) are currently the dominant technology in the commercial production of solar cells, and are the main focus of the present invention.

A desirable solar cell geometry, commonly referred to as the integrated back contact (IBC) cell, consists of a semiconductor wafer, such as silicon, and alternating lines (interdigitated stripes) of p-type and n-type doping. This cell architecture has the advantage that all of the electrical contacts to the p and n regions can be made to one side of the wafer. When the wafers are connected together into a module, the wiring is all done from one side. Device structure and fabrication means for this device have been described previously in co-owned and co-pending U.S. patent application Ser. No. 11/336,714 entitled "Solar Cell Production Using Non-Contact Patterning and Direct-Write Metallization", which is incorporated herein by reference in its entirety.

One method for forming the alternately doped line regions in an IBC solar cell is to dispose dopant bearing pastes of alternating dopant type on the wafer, and then to heat the wafer with the appropriate temperature profile to drive in the dopants. Solar cell doping and the patterning of doped regions is typically carried out with costly steps that may include the use of barrier deposition, barrier patterning, laser processing, damage removal, and gas phase furnace diffusion. One could also generate the desired doped interdigitated doped regions using screen printing techniques. However, a distinct disadvantage of screen printing is that two separate print operations would be needed to write the two dopant bearing materials, and the two prints would need to be exquisitely well registered. Moreover, screen printing requires contact with the wafer, which increases the risk of wafer damage (breakage), thus increasing overall production costs. In addition, the first screen printed layer needs to be dried before a second screen print step is applied.

The state of the art for metallizing silicon wafer-based solar cells for terrestrial deployment is screen printing. Screen printing has been used for decades, but as cell manufacturers look to improve cell efficiency and lower cost by going to thinner wafers, the screen printing process is becoming a limitation. The screen printers run at a rate of about 1800 wafers per hour and the screens last about 5000 wafers. The failure mode often involves screen and wafer breakage. This means that the tools go down every couple of hours, and require frequent operator intervention. Moreover, the printed features are limited to about 100 microns, and the material set is limited largely to silver and aluminum metallizations.

The desired but largely unavailable features in a wafer-processing tool for making solar cells are as follows: (a) never breaks a wafer—e.g. non contact; (b) one second processing time (i.e., 3600 wafers/hour); (c) large process window; and (d) 24/7 operation other than scheduled maintenance less than one time per week. The desired but largely unavailable features in a low-cost metal semiconductor contact for solar cells are as follows: (a) Minimal contact area—to avoid surface recombination; (b) Shallow contact depth—to avoid shunting or otherwise damaging the cell's pn junction; (c) Low contact resistance to lightly doped silicon; and (d) High aspect metal features (for front contacts to avoid grid shading while providing low resistance to current flow).

What is needed is a method and processing system for producing photovoltaic devices (solar cells) that overcomes the deficiencies of the conventional approach described above by both reducing the manufacturing costs and complexity, and improving the operating efficiency of the resulting photovoltaic devices.

SUMMARY OF THE INVENTION

The present invention is directed to a system and method for producing large-area ICs (e.g., silicon wafer-based solar cells) in which a mask (e.g., plastic/metallic film or paper mask) is disposed between an extrusion head and the large-area IC substrate (wafer) during extrusion of at least one of a dopant bearing material and metal gridline material (collectively referred to below as "extruded material"). The mask includes at least one of a first peripheral portion and a second peripheral portion, and a (central) opening defined along inside edges of the at least one peripheral portions (e.g., between the peripheral portions). The mask is aligned over the wafer such that the peripheral portions are positioned over corresponding peripheral areas of the wafer, and the central opening is positioned over a central active area of the wafer. The extrusion head is then moved relative to the wafer, and the extrusion material is continuously extruded through outlet orifices of the extrusion head in order to form elongated extruded structures on the active area of the wafer. By masking at least one of the peripheral areas of the wafer, deposition of the extrusion material along the masked peripheral edge of the wafer is prevented, thus avoiding a potential short circuit between the opposing surfaces of the wafer. In addition, by masking at least one of the leading and trailing edges of the wafer, the extrusion process can be initiated and stabilized prior to reaching the central area of the wafer, and/or terminated after the extrusion head has passed over the active area, thereby avoiding fragmentation of the extruded structure that can occur when extrusion is initiated and/or terminated over the wafer.

In accordance with an embodiment of the present invention, a system for producing large area IC devices (e.g., silicon wafer-based solar cells) includes forming desired doped regions in surface of a semiconductor substrate, forming a passivation layer over the substrate surface, utilizing a laser ablation or other non-contact apparatus to form contact openings in the passivation layer, utilizing a direct-write metallization apparatus to deposit contact structures in the contact openings, and then forming metallization lines on the passivation layer. In one specific embodiment, dopant bearing material is extruded through a mask in the manner described above, and then thermally treated to generate doped regions in the semiconductor substrate, thereby avoiding the problems associated with conventional screen printing techniques utilized to produce doped regions in conventional solar cells. In addition, the extrusion method described above is utilized to form the metal gridlines that operably connect the contact structures in a manner that greatly reduces the cost and complexity over conventional screen printing metallization methods. Further, by combining the non-contact processing methods set forth above, the present invention facilitates the reliable production of solar cells with minimal wafer breakage.

In accordance with an aspect of the present invention, the reliable and economic production of non-rectangular (e.g., round) solar cells is greatly facilitated by forming the mask opening to match the desired active area of the wafer. Conventional extrusion heads do not typically provide separate control over the multiple outlet orifices, making extrusion only in the central portion of a circular wafer impossible. However, by providing a mask with a circular opening that is centered over the wafer, a conventional extrusion head is reliably used to form extruded structures only in the circular active area. Similar techniques may be used to form desired extruded structures, e.g., in an octagonal (or other non-rectangular) active region.

In accordance with various embodiments, the mask may be mounted directly onto the wafer, mounted to a carrier supporting the wafer, suspended between the wafer and the extrusion head, or mounted to the extrusion head. In one embodiment, a series of masks are linked together into a single belt that is trained between opposing spools that wind clean masks over the each successive wafer. In one embodiment, a first (large) mask opening is used to position the wafer, and then a second (smaller) mask opening is positioned over the central active area of the wafer prior to the extrusion process. A third (larger) mask opening may be used to then remove the processed wafer. This third opening would also be used to position the subsequent wafer and so only two openings are used per wafer. The spooled masks are secured to the extrusion head, and in alternative embodiments may be controlled by electrical or pneumatic connections to the wafers/carriers, or may be controlled by a geared mechanism.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in photovoltaic devices (e.g., solar cells) that can be used, for example, to convert solar power into electrical energy. The following description is presented to enable one of ordinary skill in the art to make and use the invention as provided in the context of a particular application and its requirements. As used herein, directional terms such as "upper", "lower", "side", "front", "rear", are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
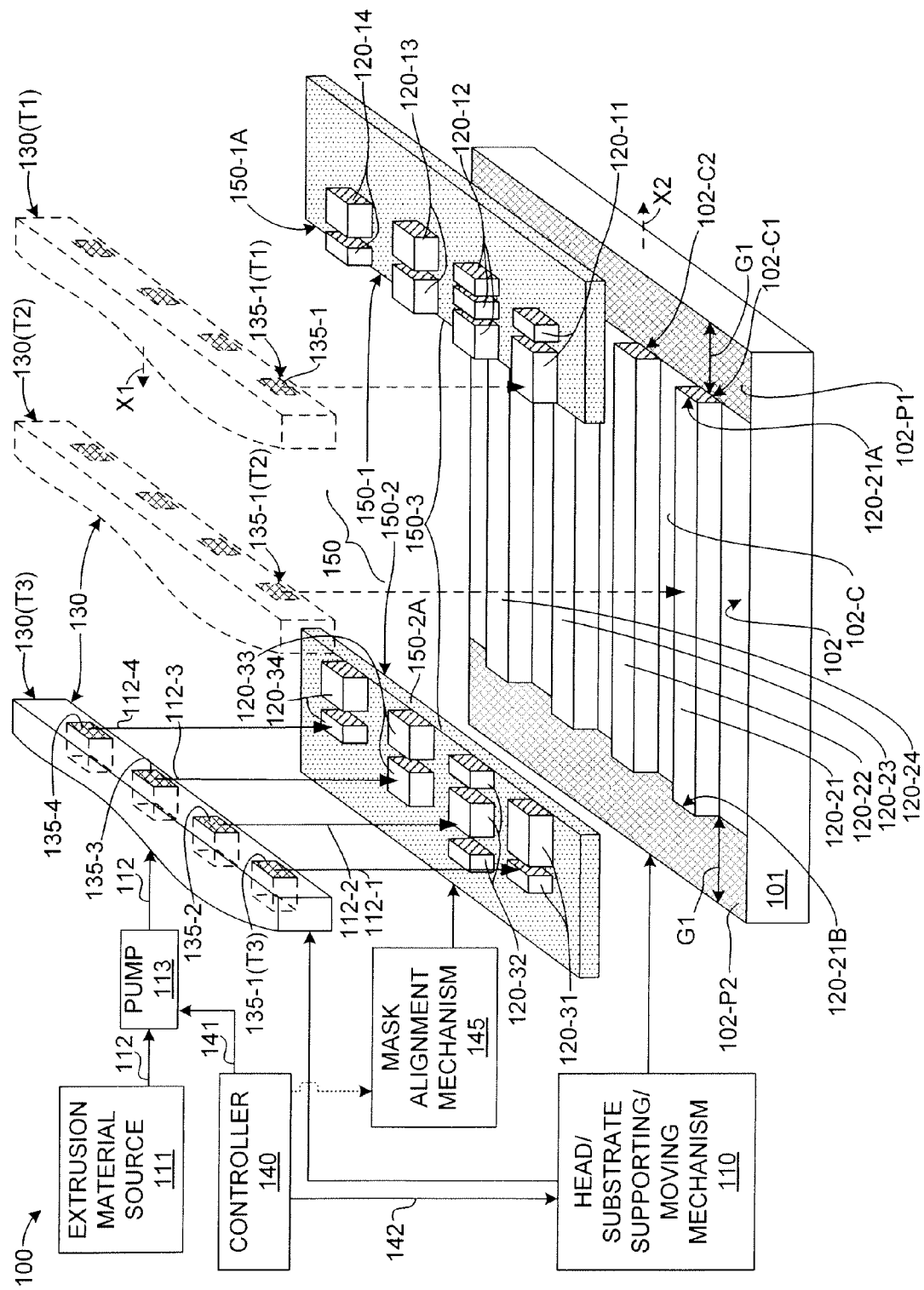
FIG. 1 is a perspective view showing an extrusion apparatus according to a generalized embodiment of the present invention.

FIG. 1 is a simplified perspective view showing an extrusion apparatus 100 utilized in the fabrication of large-area integrated circuits (e.g., wafer-based solar cells) according to a generalized embodiment of the present invention. Although the invention is described below with specific reference to the production of silicon wafer-based solar cells, those skilled in the art will recognize that the methods and structures described herein may also be used in the production of other large-area integrated circuits. Therefore, unless otherwise specifically limited, the appended claims are not intended to be directed solely to the fabrication of solar cells.

Extrusion apparatus 100 includes a support/movement mechanism 110 for supporting both a silicon wafer (semiconductor substrate) 101 and an extrusion head 130, and for moving extrusion head 130 relative to wafer 101 during the extrusion process in the manner described below. Consistent with conventional extrusion systems, extrusion head 130 is connected to an extrusion material source 111 by way of a suitable pump 113 that forces extrusion material 112 from source 111 through outlet orifices 135-1 to 135-4 of extrusion head 130, whereby multiple extruded material beads 112-1 to 112-4 are deposited to form extruded structures 120-21 to 120-24 on an upper surface 102 of wafer 101. A control circuit (controller) 140, which may be a microprocessor or application specific integrated circuit (ASIC), generates signals 141 for controlling the on/off operation of pump 113, and also to generate signals 142 for controlling the relative movement of extrusion head 130 and wafer 101 by way of support/moving mechanism 110.

As set forth in the specific embodiment below, extrusion apparatus 100 is utilized to deposit at least one of a dopant bearing material and metal line material onto wafer 101. In the example shown in FIG. 1, dopant bearing extrusion material beads 112-1 to 112-4 are deposited directly onto an upper surface 102 to form extruded structures 120-21 to 120-24, which are then subjected to thermal treatment to cause dopant (e.g., boron) contained in extruded structures 120-21 to 120-24 to diffuse into corresponding regions of wafer 101. These doped silicon regions form part of the p-n junction of the solar cell, and as such conduct electrons or holes during operation. In a similar manner, metal lines are extruded onto a passivation layer deposited over wafer 101. The metal lines are connected by metal via (connection) structures to the doped silicon regions, and serve to collect the current generate by the solar cell during operation. In each of these instances, it is important that the extruded materials do not extend to the edge of the wafer as this may cause potential electrical short circuit conditions between the opposing (i.e., upper and lower) surfaces of the wafer. Therefore, extrusion apparatus 100 must be capable of forming extrusion structures 120-21 to 120-24 such that are present only in the central "active" area 102-C of wafer 101 (i.e., not in peripheral areas 102-P1 and 102-P2). Further, extrusion structures 120-21 to 120-24 need to be "clean" (i.e., continuous/unbroken) for electrical conductivity reasons. However, conventional extrusion equipment has trouble creating clean extruded structures due to uneven flow of extruded material 112 during initiation and/or termination of the extrusion process.

In accordance with the present invention, extrusion apparatus 100 includes a mask 150 including a first portion 150-1 that is positioned over a first peripheral area 102-P1 of wafer 101, and a second peripheral portion 150-2 that is positioned over a second peripheral area 102-P2 of wafer 101. In addition, mask 150 defines a central opening 150-3 between an inside edge 150-1A of mask portion 150-1 and an inside edge 150-2A of mask portion 150-2. Central opening 150-3 is positioned over a central active area 102-C of wafer 101. Mask 150 comprises one or more of a plastic film, a metallic film, paper, or any other suitable material. Mask 150 may comprises two separate portions, as suggested in FIG. 1, or may be formed by a single sheet of material.

In accordance with an aspect of the present invention, mask 150 serves to prevent the deposition of material 112 on peripheral areas 102-P1 and 102-P2 of wafer 101 during the extrusion process. As illustrated in FIG. 1, because first portion 150-1 is disposed over peripheral area 102-P1, extruded structures 120-11 to 120-14 that are ejected from extrusion head 130 during an initial phase of the extrusion process (i.e., while extrusion head 130 is in a first position 130(T1)) (shown in dashed lines) are deposited on mask portion 150-1, and prevented from being deposited on peripheral area 102-P1. Similarly, because second portion 150-2 is disposed over peripheral area 102-P2, extruded structures 120-31 to 120-34 that are ejected from extrusion head 130 during a terminal phase of the extrusion process (i.e., while extrusion head 130 is in a second position 130(T3)) are deposited on mask portion 150-2, and prevented from being deposited on peripheral area 102-P2. By preventing the deposition of extrusion materials over peripheral areas 102-P1 and 102-P2, all conductive structures formed on or in surface 102 are offset from the peripheral edge of wafer 101 by a predetermined distance G1, thus avoiding potential short circuits between the opposing surfaces of wafer 101.

In accordance with another aspect of the present invention, mask 150 facilitates the formation of clean extrusion structures 120-1 to 120-4 by allowing the extrusion process to be initiated before extrusion head 130 is over central active region 102-C, and to be terminated after extrusion head 130 has passed over central active region 102-C. As illustrated in FIG. 1, in the present embodiment, the extrusion process is initiated just before extrusion head 130 is in position 130(T1).

As such, discontinuous extruded structures that are sputtered and/or dripped from the outlet openings at the initiation of the extrusion process (e.g., structure 120-11 from outlet opening 135-1; see also structures 120-12 to 120-14) are captured by first mask portion 150-1. In this way, the flow from outlet openings 135-1 to 135-4 is fully stabilized by the time extrusion head 130 is over central active area 120-C (e.g., in position 130(T2), shown in dashed lines in FIG. 1). In addition, the extrusion process is terminated when extrusion head 130 is in position 130(T3) over second mask portion 150-2 (i.e., after extrusion head 130 is no longer over central active region 102-C). As such, discontinuous extruded structures that are sputtered and/or dripped from the outlet openings at the termination of the extrusion process (e.g., structure 120-31 from outlet opening 135-1; see also structures 120-32 to 120-34) are captured by second mask portion 150-2. In this way, the flow from outlet openings 135-1 to 135-4 can remain stable throughout the time extrusion head 130 is travel over central active area 102-C, thereby producing clean extruded structures 120-21 to 120-24 across central active region 102-C, whereby the formation of fragmented structures (e.g., structures 120-11 to 120-14 and 120-31 to 120-34) in active region 102-C is avoided.

In accordance with an embodiment of the present invention, a mask alignment mechanism 145 is utilized to position mask 150 over wafer 101 such that central opening 150-3 is aligned over central region 102-C. As set forth in the specific embodiments below, mask alignment mechanism 145 may be an automated mechanical structure (e.g., a robotic apparatus controlled by controller 140), or may consist of an adhesive or fixture that holds mask 150 in the correct orientation relative to wafer 101 (i.e., in the manner described above and shown in FIG. 1).

Figure 2:
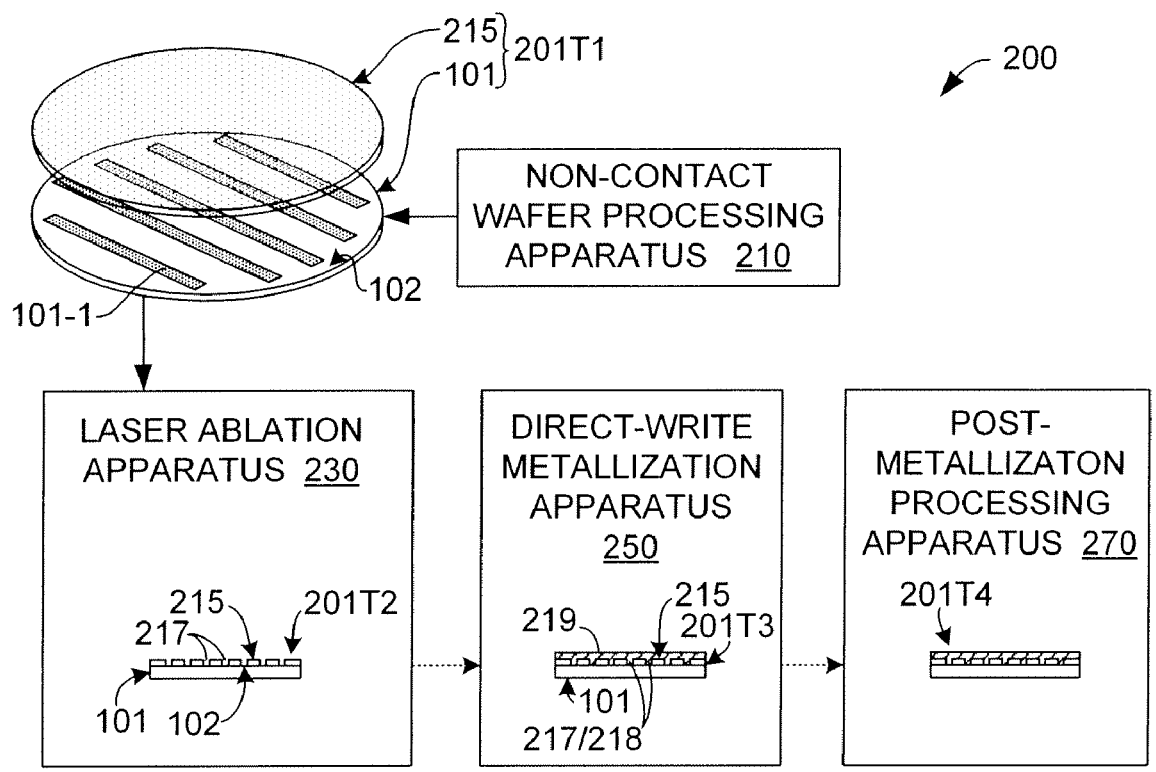
FIG. 2 is a simplified diagram showing a system for producing wafer-based solar cells utilizing the extrusion apparatus of FIG. 1 according to another embodiment of the present invention.

FIG. 2 depicts a system 200 for fabricating wafer-based solar cells using extrusion apparatus 100 (FIG. 1) and other non-contact processing techniques in accordance with another embodiment of the present invention.

As indicated at the top of FIG. 2, the fabrication process utilizes a wafer processing apparatus 210 to form one or more doped regions (e.g., elongated doped region 101-1) in a wafer (substrate) 101, and then wafer 101 is further treated to include a blanket passivation (electrically insulating) layer 215. In one embodiment, wafer processing apparatus 210 utilizes extrusion apparatus 100 (FIG. 1) to form extruded dopant bearing material structures onto wafer 101. In other embodiment, wafer processing apparatus 210 utilizes the various techniques and structures described in co-owned and co-pending U.S. patent application Ser. No. 11/609,825, entitled "SOLAR CELL FABRICATION USING EXTRUDED DOPANT-BEARING MATERIALS", which is incorporated herein by reference in its entirety. Once wafer processing is completed, passivation layer 215 is formed on upper surface 102 using known non-contact processing techniques. As referred to herein, the combined structure including wafer 101 and passivation layer 215 is generally as "device 201", and at each stage of the processing cycle is referenced with an appended suffix indicating the device's current processing stage (e.g., after formation of passivation layer 215 and prior to the ablation process described below, device 201 is referenced as "device 201T1", with the suffix "T1" indicating a relatively early point in the process cycle).

Device 201T1 is then subjected to various non-contact processes in order to produce a usable solar cell. First, as indicated at the bottom left portion of FIG. 2, a laser ablation apparatus 230 is utilized to define contact holes 217 through passivation layer 215 that expose corresponding portions of upper surface 102 of wafer 101 such that the contact holes are arranged in straight parallel rows over the doped diffusion regions. A suitable ablation process is described in additional detail in co-owned and co-pending U.S. patent application Ser. No. 11/562,383 entitled "MULTIPLE STATION SCAN DISPLACEMENT INVARIANT LASER ABLATION APPARATUS", which is incorporated herein by reference in its entirety. After contact holes 217 are defined through passivation layer 215, partially processed wafers 201T2 are passed to a direct-write metallization apparatus 250 that is utilized to deposit contact structures 218 into contact holes 217. According to an embodiment of the present invention, extrusion apparatus 100 (FIG. 1) is then utilized to form metal interconnect lines 219 on passivation layer 215 such that each metal interconnect line 219 connects the contact structures 218 disposed over an associated doped diffusion region. Additional details and alternative embodiments related to direct-write metallization device 250 are disclosed in co-owned U.S. patent application Ser. No. 11/336,714, entitled "Solar Cell Production Using Non-Contact Patterning and Direct-Write Metallization", which is incorporated herein by reference in its entirety. Finally, metallized device 201T3 is passed from direct-write metallization apparatus 250 to an optional post-metallization processing apparatus 270 for subsequent processing to form the completed solar cell 201T4.

FIGS. 1 and 3(A) to 3(F) illustrate various process steps for fabricating a wafer-based solar cell device using system 200 (FIG. 2) according to a specific embodiment of the present invention.

Referring again to FIG. 1, the fabrication process begins by the extrusion of dopant bearing material (ink) beads 112-1, 112-2, 112-3 and 112-4, which form extruded structures 120-21, 120-22, 120-23 and 120-24 on wafer 101. As described above, extruded structures 120-21, 120-22, 120-23 and 120-24 are respectively disposed on corresponding surface areas located in central active area 102-C (e.g., extruded structures 120-21 and 120-22 are respectively formed on surface areas 102-Cl and 102-C2) such that adjacent pairs of extruded structures are respectively separated by corresponding exposed surface areas.

Figure 3A:
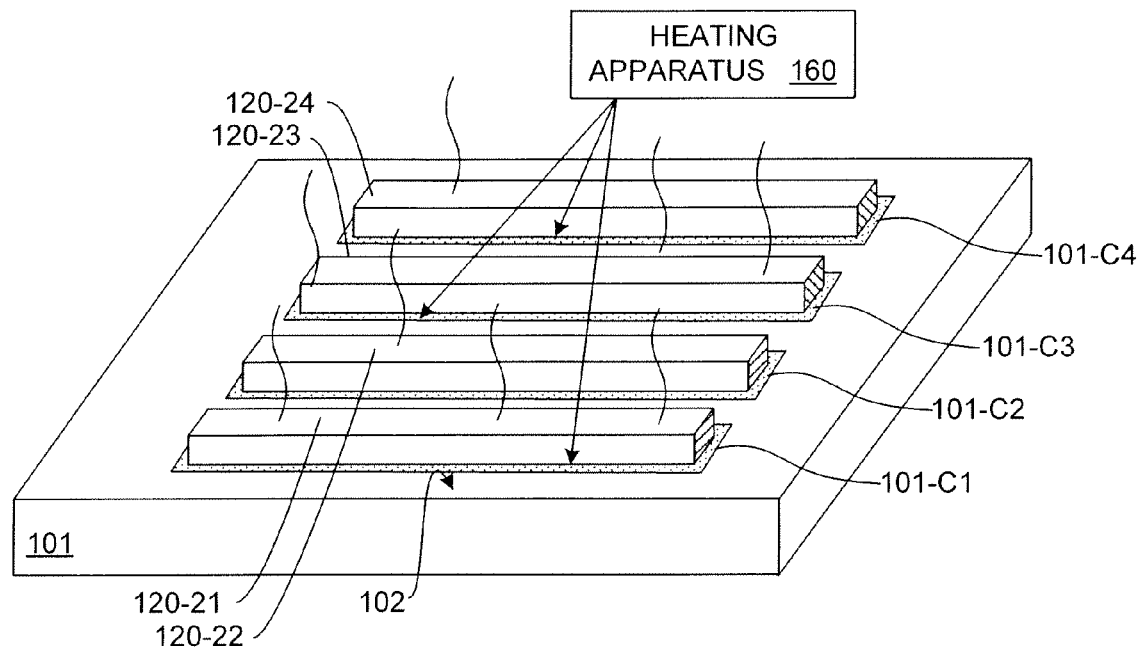
FIGS. 3(A) and 3(F) are partial perspective views showing a semiconductor substrate during a fabrication process using the system of FIG. 2.

FIG. 3(A) shows wafer 101 during a subsequent thermal treatment (heating) process using a thermal processing apparatus 160, whereby dopant from each of extruded structures 120-21, 120-22, 120-23 and 120-24 is diffused into wafer 101. Specifically, the dopant contained in the dopant ink diffuses through surface 102 to form (e.g., p-type) doped regions 101-C1, 101-C2, 101-C3 and 101-C4. Note that each doped region (e.g., doped region 101-C1) is separated from all adjacent doped regions (e.g., doped region 101-C2) by a region of lightly doped or intrinsic silicon.

Figure 3B:
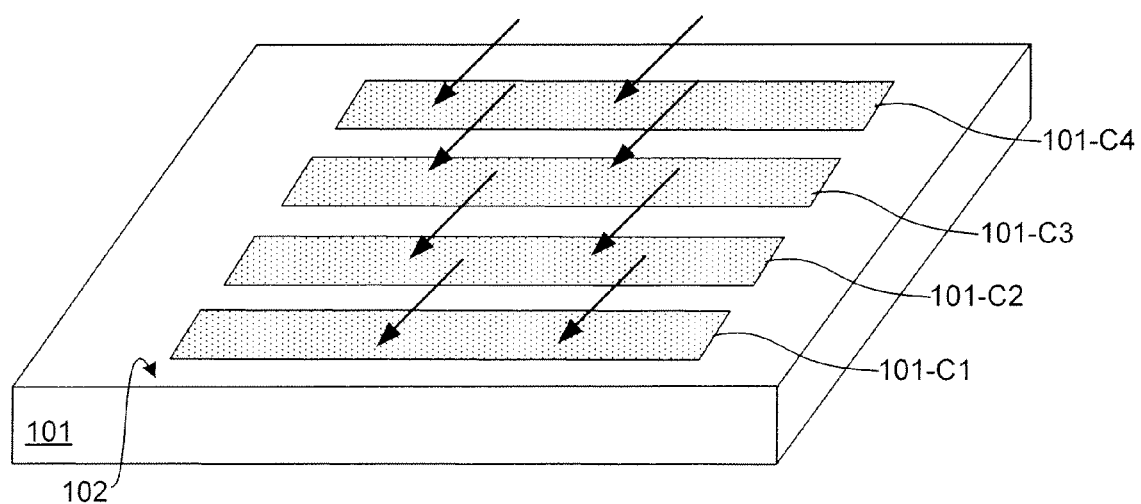

FIG. 3(B) depicts an optional process of removing residual dopant ink from surface 102 over doped regions 101-C1 to 101-C4 after the heating/diffusion process is completed. This ink removal step may be avoided by utilizing dopant inks having vehicles that burn off during the heating/diffusion process. Note that each of the doped diffusion regions 101-C1, 101-C1, 101-C3 and 101-C4 extends to upper surface 102.

Figure 3C:
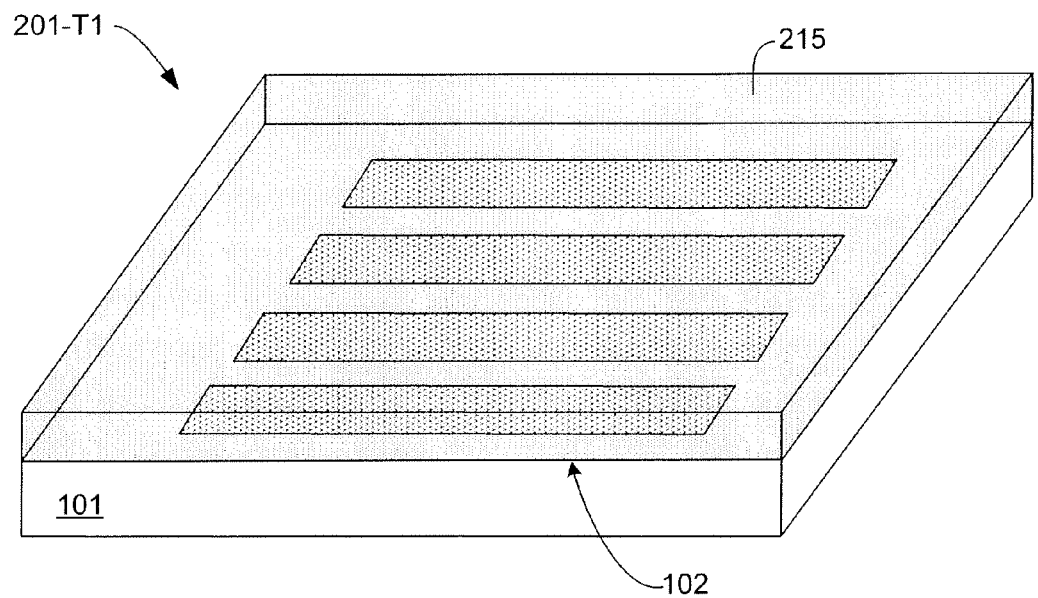

FIG. 3(C) illustrates the subsequent formation of a passivation layer 215 on upper surface 102 of wafer 101, thereby providing partially formed device 201-T1 (described above with reference to FIG. 2).

Figure 3D:
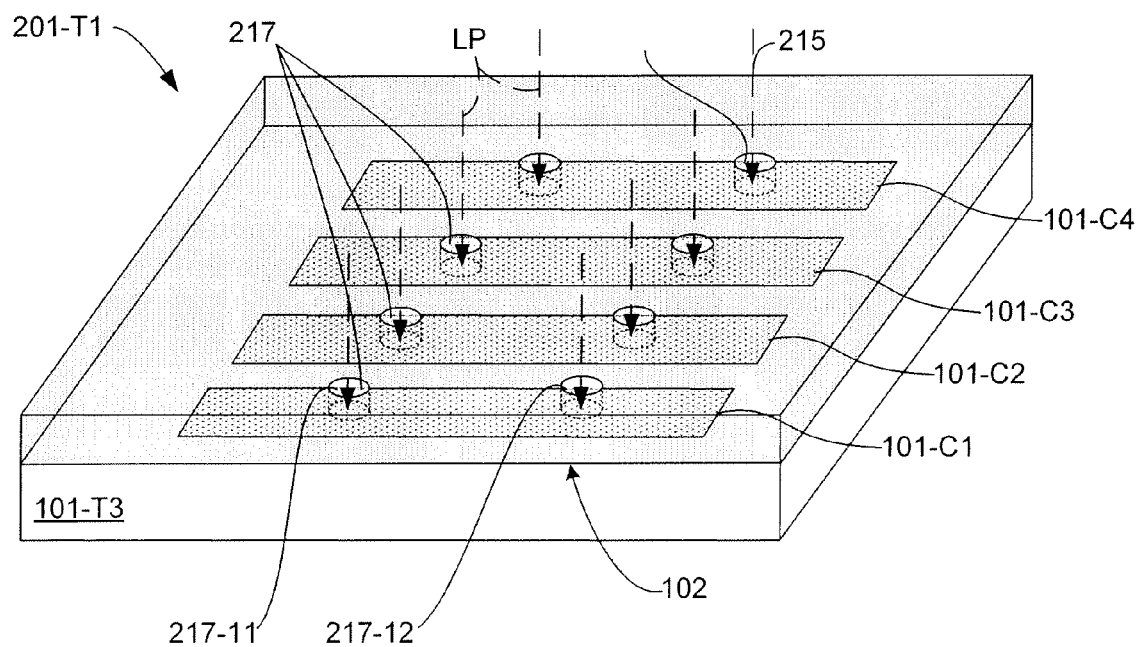

FIG. 3(D) illustrates a subsequent laser ablation process during which laser pulses LP are used to remove portions of passivation layer 215 such that contact openings 217 are defined that expose portions of surface 102 disposed over doped regions 101-C1 to 101-C4. For example, contact openings 217-11 and 217-12 extend through passivation layer 215 to corresponding portions of surface 102 that are disposed over doped region 101-C1. Similarly, contact openings 217 are formed that extend through passivation layer 215 to surface areas disposed over doped regions 101-C2, 101-C3, and 101-C4. The laser ablation process is performed using laser ablation apparatus 230, which is described above with reference to FIG. 2.

Figure 3E:
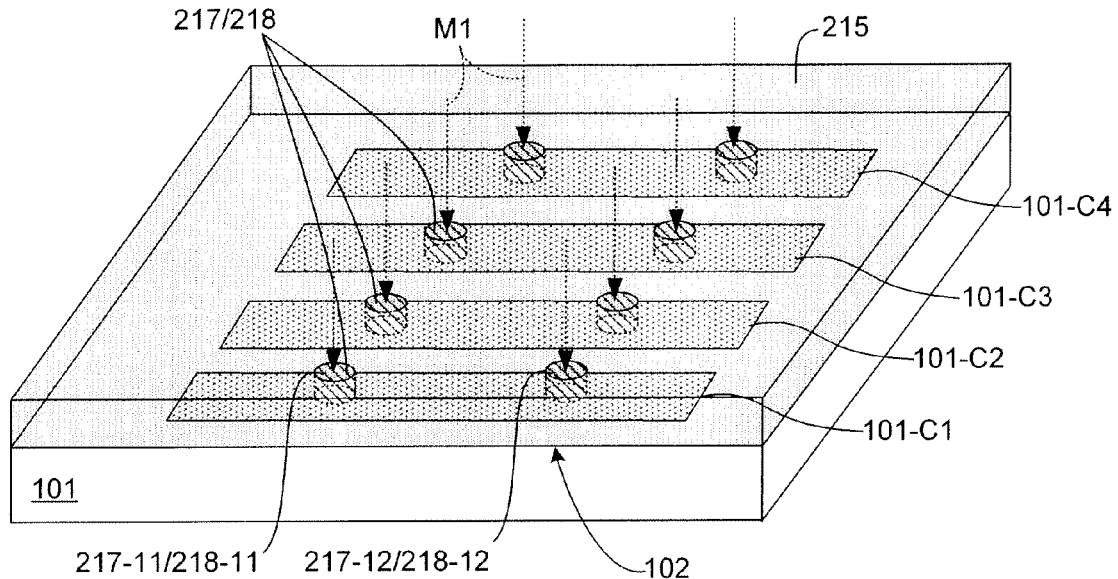

FIG. 3(E) depicts the sequential deposition of contact material M1 from direct-write metallization apparatus 250 (FIG. 2) into each opening 217 formed in passivation layer 215 such that contact structures 218 are formed directly on exposed portions of wafer 101. For example, contact structures 218-11 and 218-12 are inserted into contact openings 217-11 and 217-12, respectively, and contact portions of surface 102 that are disposed over doped region 101-C1. Similarly, contact structures 218 are formed in each contact opening 217 disposed over doped regions 101-C2, 101-C3, and 101-C4.

Figure 3F:
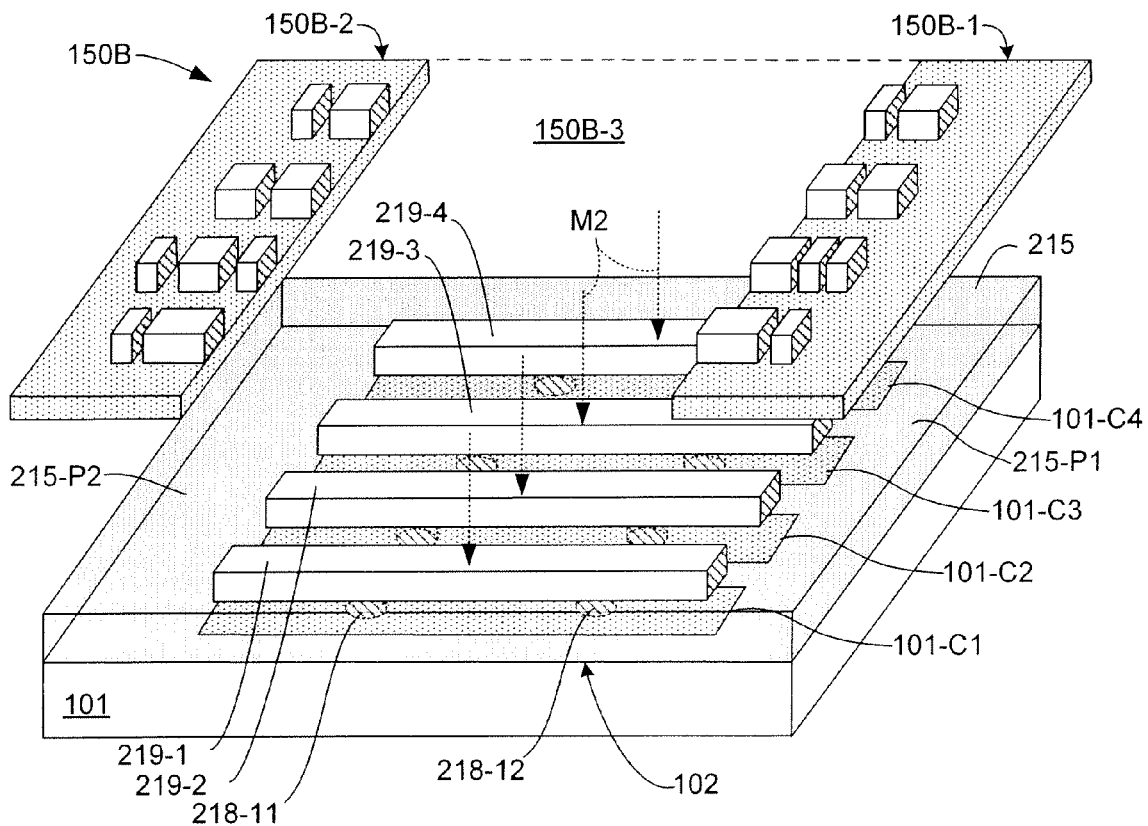

FIG. 3(F) illustrates a subsequent process of depositing metal material M2 in a manner that forms metal line structures 219-1 to 219-4 on an upper surface of passivation layer 215 using a mask 150B in a manner similar to that described above with reference to FIG. 1. In particular, mask 150B includes a first portion 150B-1 disposed over peripheral region 215-P1, a second peripheral portion 150B-2 disposed over peripheral portion 215-P2, and a central opening 150B-3 defined between portions 150B-1 and 150B-2 (i.e., over the central active region of wafer 101). Metal line material M2 is then extruded in the manner described above such that each metal line structure 219-1 to 219-4 contacts a group of contact structures that are disposed over a corresponding one of doped regions 101-C1 to 101-C4. For example, metal line structure 219-1 contacts the upper end of contact structures 218-11 and 218-12, whereby an electrical connection is provided between doped region 101-C1 and metal line structure 219-1 by way of contact structures 218-11 and 218-12. Similarly, each of metal line structures 219-2, 219-3 and 219-4 are electrically connected to doped regions 101-C2, 101-C3 and 101-C3 by way of corresponding contact structures.

In accordance with another aspect of the present invention, as set forth below with reference to FIGS. 4(A) and 4(B), even if conventional extrusion systems could be controlled to cleanly start and stop the extruded structures to avoid the electrical shorting and fragmentation problems described above, the masking approach described herein would still be useful in that it would facilitate the reliable and economic production of non-rectangular (e.g., round or octagonal) solar cells.

Figure 4A:
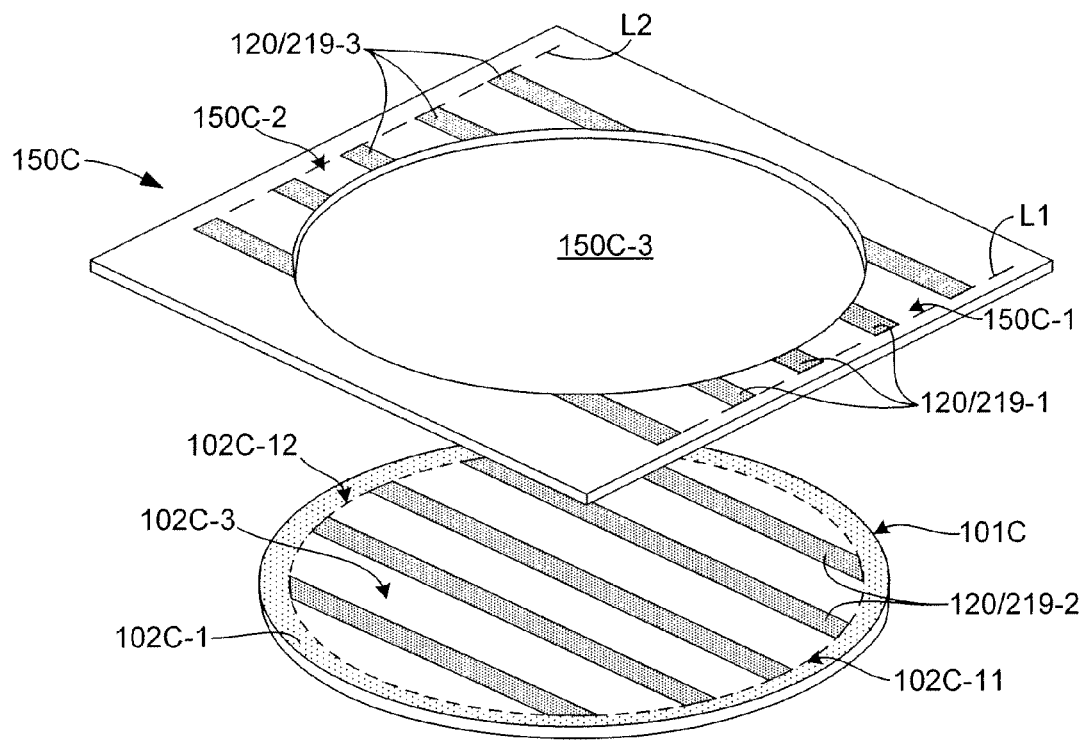
FIGS. 4(A) and 4(B) are perspective and plan views showing non-rectangular semiconductor substrates and associated masks according to another aspect of the present invention.

FIG. 4(A) is a simplified perspective view showing a mask 150C for forming a solar cell on a circular wafer (substrate) 101C, and in particular for forming one of dopant bearing extrusion structures and metal line structures (collectively referred to as extruded structures 120/219-2) in the manner described above. Note that, as in the case of rectangular substrates, extruded structures 120/219-2 must be restricted to a central circular active area 102C-3, and must not be deposited in a predetermined annular peripheral area 102C-1 (indicated by shading) that surrounds active area 102C-3. To facilitate extrusion only in active area 102C-3, mask 150C includes a first peripheral area 150C-1 that is located on an upstream end of a circular central opening 150C-3, and a second peripheral portion 150C-2 that is located on a downstream end of central opening 150C-3. Central opening 150C-3 is sized and positioned to expose only central active area 102C-3 during the extrusion process. Note that the nozzles (outlet orifices) of conventional extrusion heads are not individually controllable, and extruded structures 120/

219-1 start at the same point (i.e., along line L1) and terminate at the same point (i.e., along line L2), thus making conventional extrusion heads incapable of printing non-rectangular regions. As indicated in the upper portion of FIG. 4(A), by providing mask 150C with circular central opening 150C-3, extruded structures 120/219-1 are deposited on first peripheral area 150C-1 such that the leading edges of extruded structures 120/219-2 are aligned along a curved edge 102C-11 of peripheral area 102C-1, and extruded structures 120/219-3 are deposited on second peripheral area 150C-2 such that the trailing edges of extruded structures 120/219-2 are aligned along curved edge 102C-12 of peripheral area 102C-1 adjacent to second peripheral area 150C-2. Thus, by utilizing mask 150C, the extruded material that is allowed to pass through central opening 150C-3 and deposit on wafer 101C is shaped to match active area 102C-3 without requiring individual control of the extrusion nozzles, thus facilitating the use of conventional extrusion heads, which only extrude a uniform rectangular pattern, to form non-rectangular two-dimensional extrusion patterns.

Figure 4B:
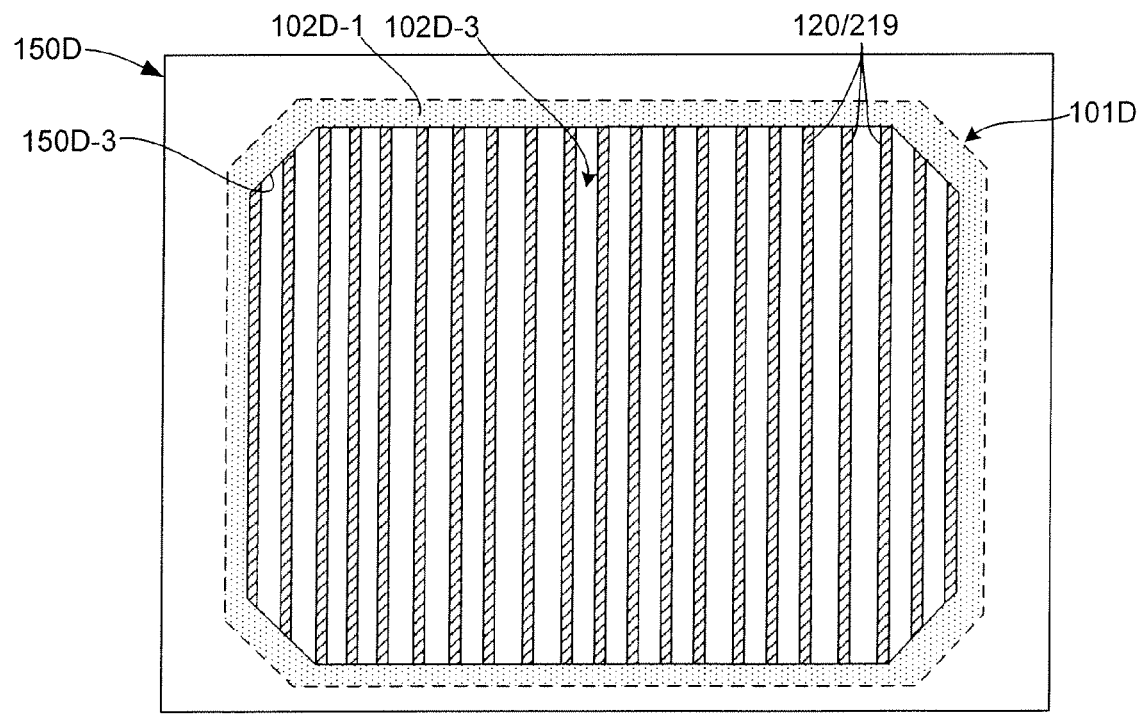

FIG. 4(B) is a simplified plan view depicting a second example including a wafer 101D having a non-rectangular (octagonal) active area 102D-3 surrounded by an octagonal peripheral area 102D-1, and a corresponding mask 150D defining an octagonal central opening 150D-3. As in the previous examples, mask 150D prevents the formation of extruded structures 120/219 on any portion of wafer 101D other than octagonal active area 102D-3.

Figure 5:
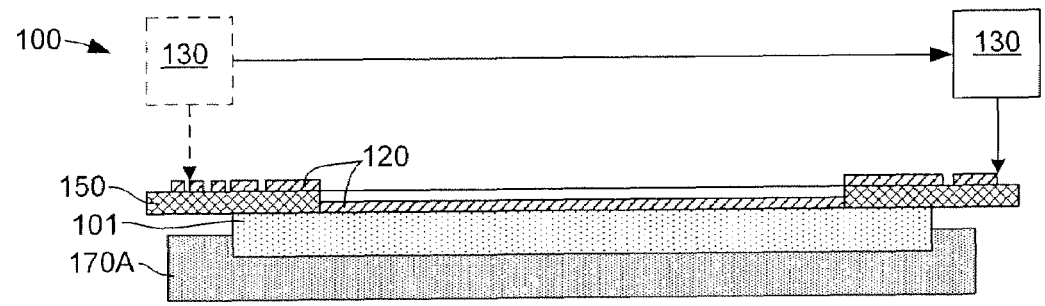
FIG. 5 is simplified cross-sectional side view showing a mask mounted on a semiconductor substrate according to a specific embodiment of the present invention.
Figure 6:
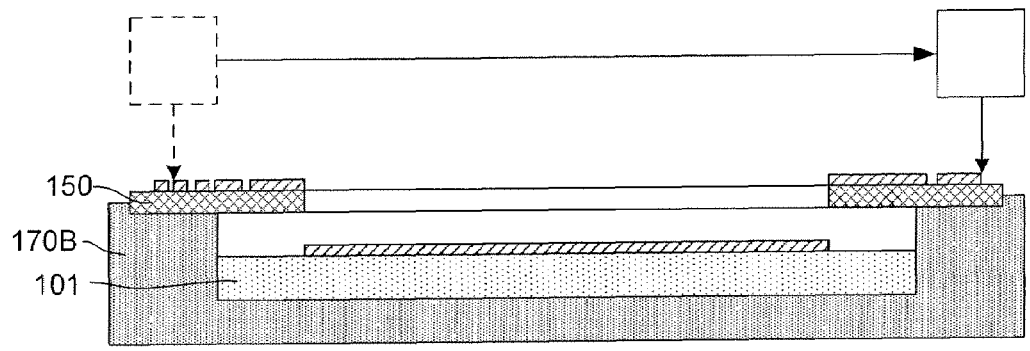
FIG. 6 is simplified cross-sectional side view showing a mask mounted on a wafer carrier according to another specific embodiment of the present invention.
Figure 7:
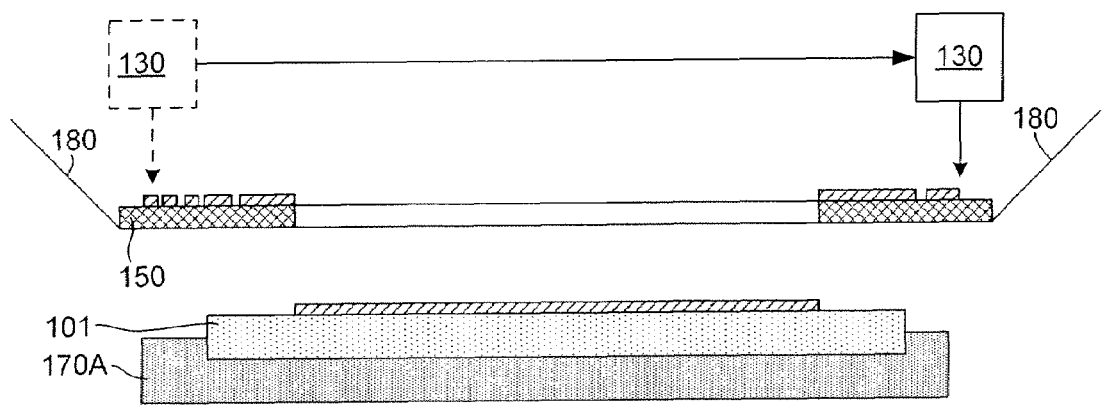
FIG. 7 is simplified cross-sectional side view showing a mask suspended between an extrusion head and a wafer according to another specific embodiment of the present invention.

FIGS. 5, 6 and 7 are cross-sectional side views showing extrusion apparatus 100 in additional detail according to various specific embodiments of the present invention. During the extrusion process each wafer is typically attached to a carrier that moves under the extrusion head (e.g., using a vacuum chuck). In a possible embodiment depicted in FIG. 5, wafer 101 is mounted on a carrier 170A, and mask 150 is attached directly to the peripheral area of wafer 101 using, for example, a suitable adhesive. However, this embodiment is not favored due to the wafer's fragility and the relatively small peripheral areas (margins) of the wafer that are to be screened off by mask 150. FIG. 6 shows a more preferable embodiment in which mask 150 is attached to carrier 170B such that mask 150 is held over wafer 101. Carrier 170B could be built with attachment points or other fixtures for securing mask 150, and a new mask could be fitted over each new wafer that is placed carrier 170B. Alternatively, as depicted in FIG. 7, a suspension mechanism 180 may be utilized to suspend mask 150 between extrusion head 130 and wafer 101/carrier 170A.

Figure 8A:
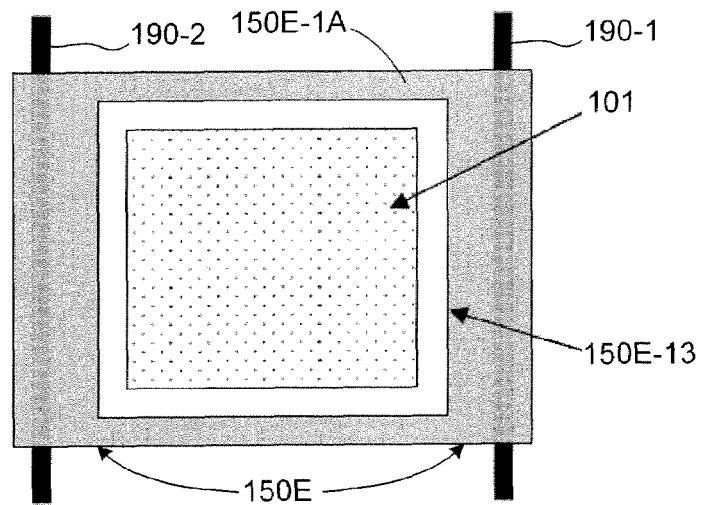
FIGS. 8(A), 8(B) and 8(C) are top plan views showing a spooling mechanism for supporting a mask according to another specific embodiment of the present invention.
Figure 8B:
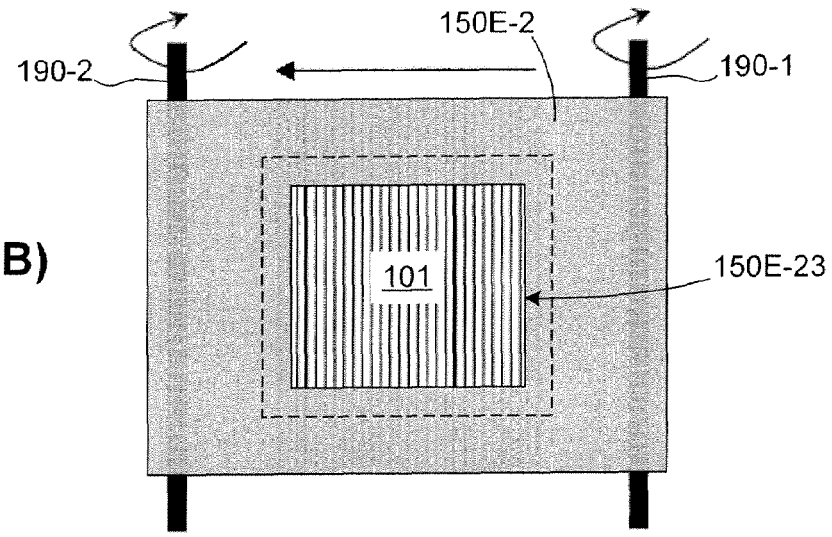
Figure 8C:
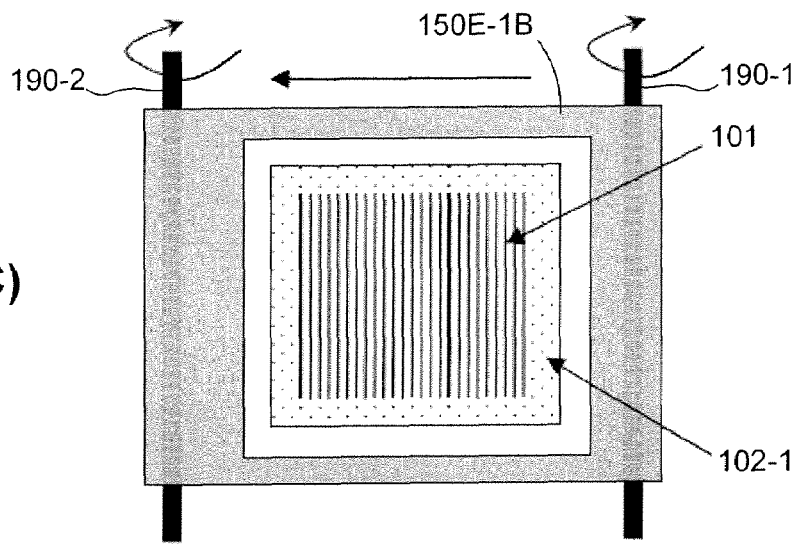

Individually attaching and removing the mask for each wafer would also be difficult. FIGS. 8(A) to 8(C) are simplified top views depicting another embodiment in which a series of masks are linked together by a single belt 150E, and are rolled from a first (cylindrical) spool 190-1 positioned on one side of wafer 101 to a second spool 190-2 located on the other side of wafer 101. In this embodiment, each time a new wafer 101 is placed (e.g., in a carrier) under a corresponding mask, the spools could wind to position the next (clean) mask over the new wafer. As depicted in FIGS. 8(A) to 8(C), to allow easy placement of a new wafer onto a carrier for extrusion, mask belt 150E could have two openings for each wafer. FIG. 8(A) depicts a first, relatively large opening 150E-1A that has a corresponding opening 150E-13 that is large enough to allow placement of wafer 101 through opening 150E-13 onto the carrier. After wafer 101 is placed, as indicated in FIG. 8(B), belt 150E is rolled to position a second mask 150E-2 over wafer 101, where mask 150E-2 has a smaller opening 150E-23 that exposes only the active area of wafer 101 in the manner described above. Once the extrusion process is completed, as indicated in FIG. 8(C), belt 150E is rolled again to position a next sequential mask 150E-1B over wafer 101, thereby allowing removal of wafer 101 and placement of a new wafer. Thus, in this embodiment, spools 190-1 and 190-2 would advance twice for each wafer. Note that, as in the above examples, extruded structures are omitted from the peripheral area of wafer 101 (e.g., peripheral area 102-1).

A mechanism of spooling masks across the wafer will likely require electrical or pneumatic connections to each of the carriers. In an alternative embodiment, a geared mechanism may be used in which a cog in the bottom of the wafer carrier engages a rack, and the motion of the carrier spools the mask when needed. But without electrical connections, monitoring the state of the mask feed spool (e.g. noting that it is close to empty) would be difficult. In any case, all these solutions would significantly complicate the carrier design.

Figure 9:
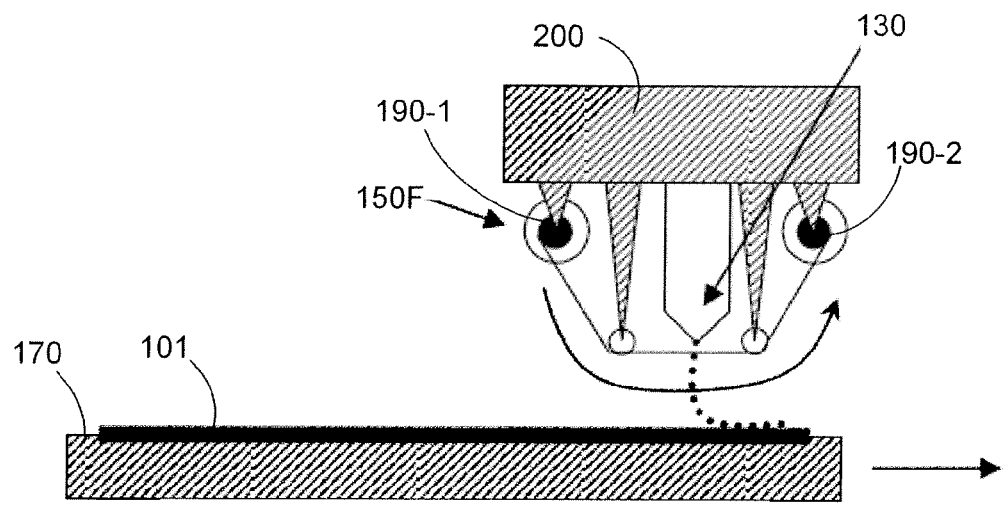
FIG. 9 is simplified cross-sectional side view showing a mask connected to an extrusion head according to another specific embodiment of the present invention.
Figure 10:
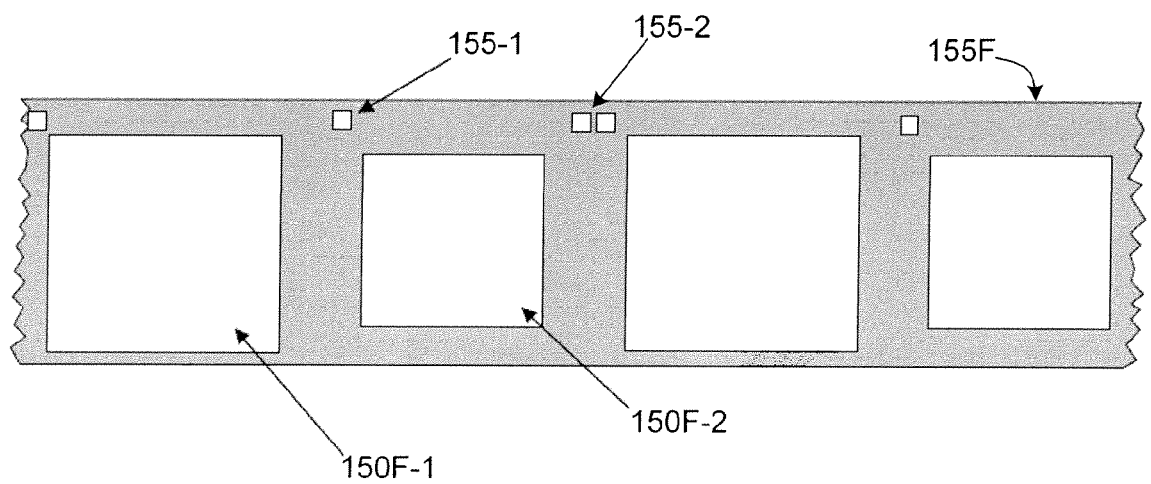
FIG. 10 is a top plan view showing a mask including index markers for controlling a spooling process according to another alternative embodiment of the present invention.

FIG. 9 is simplified cross-sectional side view showing a mask belt 15OF connected to an extrusion head mount (gantry) 200 according to another specific embodiment of the present invention. This embodiment provides a solution to the above-mentioned problems by keeping spools 190-1 and 190-2 in a fixed location (i.e., attached to gantry 200) that is already cabled (i.e., electrically connected to the system controller. This arrangement prevents the need for double spooling, since the presence of each mask on mask belt 150F will not impact the loading and unloading of the wafers. Obviously the mask motion must be synchronized with the passage of the wafers. One possible method for achieving this synchronization is shown in FIG. 10, where optically readable index markers 155-1 and 155-2 are provided on mask belt 150F to provide position feedback to the spool motors regarding the position of mask openings 150F-12 and 150F-23. A similar marker may also be used to signal how many unused masks remain on the belt.

Although the present invention has been described with respect to certain specific embodiments, it will be clear to those skilled in the art that the inventive features of the present invention are applicable to other embodiments as well, all of which are intended to fall within the scope of the present invention. For example, although the invention is described with reference to masks that have respective portions covering the leading and trailing end of a wafer, a mask may be beneficially used that includes only one of these portions, although this may expose the un-masked end of the wafer to the shorting problem described above. Further, although the invention is described with specific reference to solar cells having an integrated back contact (IBC) cell geometry (i.e., including elongated doped regions 214), the present invention may also be utilized to produce other solar cell types.

The invention claimed is:

1. A system for fabricating an integrated circuit on a semiconductor substrate, the system comprising:

an extrusion head including a plurality of outlet orifices; a mask having a first peripheral portion defining a first inside edge and a central opening defined by the first inside edge;

means for aligning the mask such that the first peripheral portion is positioned over one of a first peripheral area of the semiconductor substrate and a second peripheral area of the semiconductor substrate, and such that the central opening is positioned over a central area of the semiconductor substrate disposed between the first and second peripheral areas;

means for moving the extrusion head relative to the semiconductor substrate such that the plurality of outlet orifices are moved from a first position over the first peripheral area to a second position over the second peripheral area, whereby the plurality of outlet orifice pass over the central area of the semiconductor substrate;

means for controlling extrusion of a material such that said material is continuously extruded through the plurality of outlet orifices while the extrusion head is moved from the first position to the second position, whereby the extruded material forms a plurality of elongated extruded structures on the central area of the semiconductor substrate.

2. The system according to claim 1, wherein the mask further comprises a second peripheral portion defining a second inside edge, and wherein the central opening is disposed between the first and second inside edges;

wherein said means for aligning the mask comprises means for positioning the first peripheral portion over the first peripheral area of the semiconductor substrate, and positioning the second peripheral portion over the second peripheral area of the semiconductor substrate.

3. The system of claim 1, wherein said means for controlling extrusion comprises means for initiating said extrusion when the extrusion head is in the first position, and terminating said extrusion when the extrusion head is in the second position.

4. The system of claim 1, wherein the mask comprises one of a plastic film, a metallic film and paper.

5. The system of claim 1, wherein the central opening comprises one of a rectangular opening, a round opening and an octagonal opening.

6. The system of claim 1, further comprising means for heating the plurality of elongated extruded structures such that a dopant contained in said plurality of elongated extruded structures diffuses into the semiconductor substrate, thereby forming a plurality of doped regions.

7. The system according to claim 6, further comprising:

means for depositing a passivation layer on a surface of the semiconductor substrate over the plurality of doped regions, means for laser ablating portions of the passivation layer such that a plurality of contact openings are defined through the passivation layer to each of the plurality of doped regions, means for depositing a conductive contact structure into each of the contact openings using a direct-write metallization apparatus, and means for depositing metal line structures onto an upper surface of the passivation layer such that each metal line structure contacts a group of said contact structures that are disposed over a corresponding one of said doped regions.

8. The system according to claim 7, wherein said means for depositing said metal line structures comprises a second mask having a first peripheral portion positioned over a first peripheral area of the passivation layer, a second peripheral portion positioned over a second peripheral area of the passivation layer, and a central opening is positioned over the central area of the semiconductor substrate.

9. The system according to claim 1, further comprising means for depositing a passivation layer on a surface of the semiconductor substrate before extruding said material.

10. The system of claim 1, wherein the mask is attached to the semiconductor substrate.

11. The system of claim 1, wherein the semiconductor substrate is mounted on a carrier, and wherein the mask is attached to the carrier over the semiconductor substrate.

12. The system of claim 1, wherein the mask is suspended between the carrier and the extrusion head.

13. The system of claim 1, wherein the mask is mounted on a belt having a first portion wound around a first spool and a second portion wound around a second spool, and wherein said means for aligning the mask comprises means for rotating the first and second spools such that the central opening of the mask is positioned over the central area of the semiconductor substrate.

14. The system of claim 13, wherein the belt comprises alternating large and small mask openings.

15. The system of claim 13, wherein each of said extrusion head and said first and second spools are mounted to a gantry.

16. The system of claim 13, wherein the belt comprises a plurality of optically readable index markers.

17. The system of claim 13, wherein said means for rotating the first and second spools comprises one of an electrical connection, a pneumatic connection, and a mechanical mechanism.

* * * * *